July 6, 1971 E. R. STREED 3,591,420

SOLAR CELL

Filed Feb. 6, 1969

INVENTOR
ELMER R. STREED

BY [signature]
[signature]
ATTORNEYS

United States Patent Office 3,591,420

Patented July 6, 1971

3,591,420

SOLAR CELL

Elmer R. Streed, Los Altos, Calif., assignor to the United States of America as represented by the Administrator of the National Aeronautics and Space Administration Filed Feb. 6, 1969, Ser. No. 797,219
Int. Cl. H01l 15/02
U.S. Cl. 136—89 6 Claims

ABSTRACT OF THE DISCLOSURE

A solar cell utilizes phosphors in the cover glass which are excited to fluorescence by solar ultraviolet radiation and particulate radiation. This fluorescent energy passes through the interference filter for utilization in the solar cell, whereas the ultraviolet and other radiation would not normally be converted to electrical energy because the wavelength is not within the spectral response limits of the solar cell.

The invention described herein may be manufactured and used by or for the Government of the United States of America for governmental purposes without the payment of any royalties thereon or therefore.

BACKGROUND OF THE INVENTION

Field of the invention

This invention relates in general to solar cells, and relates more particularly to such cells having improved energy output in response to a given amount of input radiation.

Description of the prior art

Solar cells are well known in the art, and generally employ a semiconductor material, such as silicon, in contact with two spaced electrodes. When the semiconductor body is activated with small amounts of suitable impurities, it will convert solar radiation impinging upon it into direct current electrical power. Briefly, the mechanism involved is that when light particles are absorbed by the semiconductor material, this gives rise to hole-electron pairs in the conduction band. The electric field existing in the semiconductor wafer then forces the holes in the p-region and the electrons into the n-region, for a P/N material, thereby making the p-region positive and the n-region negative. Displacement of these newly freed charges produces a voltage which then supplied electrical power to an external circuit.

The radiation responsive materials used in solar cells are generally sensitive only to radiation lying within a relatively narrow portion of the solar radiation spectrum. This sensitive band is usually considered to be between 0.4 and 1.1 microns in wavelength, the upper limit being determined for silicon by the fact that its energy gap causes it to be transparent to wavelengths greater than about 1.1 microns. However, a substantial portion of the total solar radiation occurs at wavelengths shorter than 0.4 micron (generally in the ultraviolet region). Absorption of this solar energy of wavelengths below the sensitive range of the solar cell results in the production of unwanted heat in the cell, thereby increasing the cell temperature and lowering its conversion efficiency.

To prevent this undesired energy from reaching the solar cell material, interference filters have been proposed, such as described in U.S. Pat. 3,076,861. These filteres generally comprise alternate layers of high and low index of refraction materials, so arranged as to produce selective reflection of a great portion of the wavelengths below the range to which the cell is to be responsive.

While such a solar cell with an interference filter is effective to reduce or eliminate the heating effects of the undesired wavelengths by reflecting them, the energy representedby the reflected wavelengths is not available for conversion to electrical energy, so that the solar cell must operate on the portion of the total solar energy lying within the pass band of the interference filter. Further, such devices generally have a cover to protect the cell from particulate radiation, so that this source of energy is not available for conversion in the cell.

In addition to the above solar cells, it is known in the art to utilize fluorescent materials to convert X-ray radiation or the like to visible radiation for actuating photo-voltaic detectors. An example of such a device is shown in U.S. Pat. 2,259,372, in which the X-rays to be detected are directed toward a fluorescent material to produce visible fluorescent radiation. This latter radiation is directed toward the selenium photo-voltaic detector to cause the detector to generate a signal which is a measure of the intensity of the X-ray radiation.

While such a device is operative to convert X-ray radiation to fluorescent radiation to produce a measure of the X-ray intensity, such a device is primarily only a detector in which one form of energy is converted to another to accommodate the response characteristics of the detector.

SUMMARY OF THE PRESENT INVENTION

In accordance with the present invention, there is provided a solar cell of improved efficiency which employs a phosphor material in the cell cover glass, the phosphor material being excited by solar ultraviolet radiation and particulate space radiation (protons and/or electrons). The cell of this invention includes an interference filter which prevents ultraviolet radiation from reaching the solar cell material, since, as indicated above, this ultraviolet radiation generally increases the temperature of the cell material without producing any significant amount of electrical energy therein. By employing the phosphor material in the cell cover glass, the ultraviolet radiation impinging on the glass is converted to fluorescent radiation within the wavelength range which will pass through the interference filter and to which the cell will respond for the generation of electrical energy. Also, the phosphor material is excited by particulate radiation such as protons and electrons, and emits radiation in response to this exciatation which passes through the interference filter and is utilized in the production of electrical energy in the cell.

Thus, the solar cell of this invention utilizes visible solar radiation for conversion to electrical energy and converts solar ultraviolet radiation and particulate radiation to visible radiation for conversion to electrical energy. This double action significantly increases the efficiency of the solar cell and results in an increased electrical output compared to a conventional solar cell which does not convert ultraviolet and/or particulate radiation to fluorescent energy within the response range of the cell.

It is therefore an object of this invention to provide a solar cell having improved efficiency and electrical output.

It is a further object of the present invention to provide a solar cell in which radiation which is outside the normal range of response of the cell is converted to radiation which is within the response range of the cell.

It is an additional object of this invention to provide a solar cell in which ultraviolet radiation and/or particulate radiation, which is not usable in the cell for conversion to electrical energy, is converted to radiation which is usuable in the cell for the generation of electrical energy.

It is a further object of the present invention to provide a solar cell employing a phosphor which is excited by radiation which is outside the range of response of the cell, to produce fluorescent radiation which is within the range of response of the cell, the cell thus responding to both visible solar radiation and to fluoroescent radiation produced by the phosphor material.

Objects and advantages other than those set forth above will be apparent from the following description when read in connection with the accompanying drawing, in which:

DESCRIPTION OF THE PREFERRED EMBODIMENT

Figure 1:
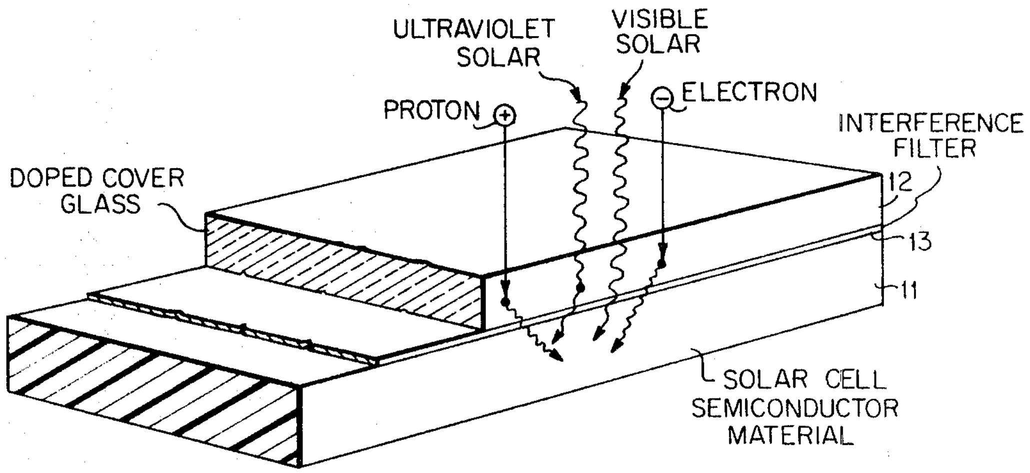
FIG. 1 is a perspective view, partly in cross section, of a solar cell constructed in accordance with this invention.

Referring to FIG. 1, one embodiment of the present invention is shown and includes a semiconductor material 11, such as an N/P type silicon. The cell also includes electrical leads (not shown) connected to material 11 and across which the electrical output of the cell occurs. The structure also includes a cover glass member 12 which is doped with a suitable phosphor material to produce fluorescent radiation in response to excitation by ultraviolet and/or particulate radiation. For example, cover glass 12 may be a radiation resistant fused silica having a thickness of 6 mils or more. This fused silica is doped with a suitable phosphor material, such as the rare earth terbium ($TB^{3+}$) and/or europium ($Eu^{3+}$) ions in concentrations of 1 to 1000 parts per million.

Cover glass 12 is transparent to visible solar radiation and preferably has a relatively high emittance to facilitate radiation of infrared radiation from the cell. The structure also includes an interference filter 13 placed between the semiconductor material 11 and the cover glass 12. Such a filter may be of any suitable type which functions in the manner described in the above-mentioned U.S. Pat. 3,076,861 to selectively reflect away from material 11 radiation lying below the lower limit of response of the cell material (generally considered to be about 0.4 micron). The filter may be formed by any suitable technique, such as by vacuum depositing a plurality of layers on the underside of cover glass 12 to produce a multilayer dielectric type interference filter. In some instances, filter 13 may also reflect infrared radiation to reduce the heat load on the cell.

Figure 2:
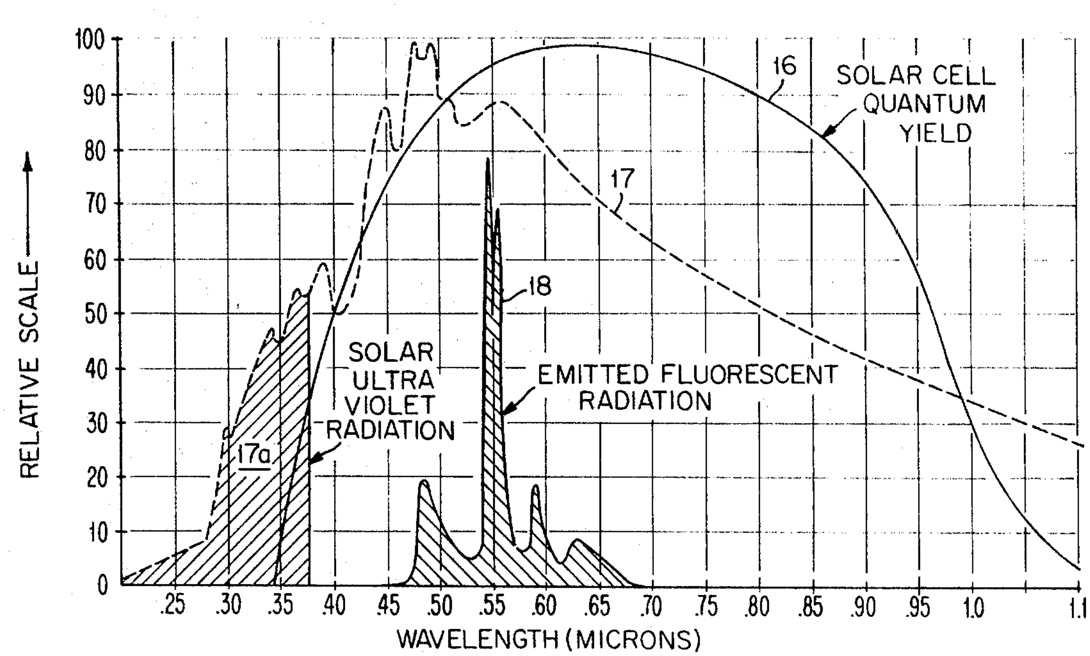
FIG. 2 contains graphs illustrating the operation of the solar cell of this invention in improving the efficiency of the cell.

The operation of the device can best be understood by reference to the curves of FIG. 2, in which curve 16 represents the quantum yield of the solar cell and has limits between about 0.35 micron on the lower end and 1.1 microns on the upper end. The broken line curve 17 represents the distribution of solar energy as a function of wavelength, and the portion **17*a* under this curve represents the solar energy in the ultraviolet region. As indicated above, this ultarviolet radiation is not useful in the solar cell for the production of electrical energy, and hence is reflected from the semiconductor material 11 in a normal solar cell by interference filter 13**.

However, in the present invention, this ultraviolet radiation, in impinging on cover glass 12, excited the phosphor material therein to fluorescence, producing radiation from the phosphor at wavelengths greater than 0.45 micron. This is shown by the curve 18 of FIG. 2, illustrating the conversion of the solar ultraviolet radiation to radiation having a wavelength range from 0.45 micron to about 0.68 micron. This range is passed by interference filter 13 and is within the usable range for semiconductor material 11 for the production of electrical energy. Thus, the solar cell of the present invention responds to visible solar radiation, which passes through cover glass 12 and filter 13 to material 11, as shown schematically in FIG. 1, and also responds to ultarviolet radiation which is converted to fluorescent radiation in doped cover glass 12 so as to pass through filter 13 and be utilizable by material 11 in generating electrical energy.

The effectiveness of the structure of the present invention in increasing the efficiency of solar cell operation can be appreciated from the following considerations. Since about 7 percent of the solar radiation is at wavelengths below 0.375 micron, and quantum efficiencies as high as 40 percent have been achieved with rare earth ions in oxide compound host materials, a potential conversion of 2.8 percent of the total solar radiation into longer wavelength emitted radiation is possible. If one-half of this radiation is transmitted to the solar cell and the cell has a quantum yield of 80 percent at the fluorescent wavelengths, then the efficiency of the solar cell would be increased by 1.12 percent of the total solar energy. Since typical N/P silicon cells have an efficiency of converting 11 percent of the total solar radiation, the additional 1.12 percent resulting from the present invention would produce a 10 percent increase in electrical output for the same cell.

In addition to converting the solar ultraviolet radiation to fluorescent energy at wavelengths usable in the solar cell, the present invention can utilize the fluorescence of rare earth ion doped cover glass material when irradiated by protons or electrons to increase the efficiency of the solar cell. Such particular radiation occurs in space as solar wind protons, solar flare protons and radiation belt electrons, and are absorbed in the cover glass of conventional solar cells to keep them from degrading the performance of the cell. As shown schematically in FIG. 1, such protons or electrons, in striking the doped cover glass 12, excite the phosphor material to flourescence to produce fluorescent energy which is within the usable range of the cell. Although little quantitative data is available on the conversion of absorbed particulate radiation energy to emitted fluorescent radiation, the fluorescent phenomena has been demonstrated in the laboratory. Relative measurements of the fluorescent radiation resulting from 50 to 100 kev. proton irradiation of silicon dioxide powder has shown the maximum radiation to occur at wavelengths between 0.60 and 1.0 micron, which is well within the usable range for solar cells.

While the above detailed description has shown, described and pointed out the fundamental novel features of the invention as applied to various embodiments, it will be understood that various omissions and substitutions and changes in the form and details of the device illustrated may be made by those skilled in the art, without departing from the spirit of the invention. It is the intention, therefore, to be limited only as indicated by the scope of the following claims.

I claim:

1. A solar radiation converter comprising:

a photoresponsive semiconductor member having a spectral sensitivity to a defined wavelength band of electromagnetic radiation for converting electromagnetic energy within said wavelength band to electrical energy;

an interference filter member overlying said semiconductor member for transmitting to said semiconductor member only electromagnetic radiation within said wavelength band; and a cover glass member overlying said interference filter member, said cover glass member being transparent to radiation within said defined wavelength band, said cover glass member containing a fluorescent material which is excited by electromagnetic radiation outside said wavelength band to produce fluorescent radiation lying within said wavelength band.

2. A device in accordance with claim 1 in which said fluorescent material is rare earth ion.

3. A device in accordance with claim 2 in which said rare earth ion is selected from the group consisting of rare earth elements such as terbium and europium.

4. A device in accordance with claim 1 in which said defined wavelength band is between about 0.4 micron and 1.1 microns.

5. A device in accordance with claim 4 in which said fluorescent material is responsive to electromagnetic radiation having wavelengths shorter than about 0.375 micron to produce fluorescent radiation of 0.45 micron and longer.

6. A device in accordance with claim 1 in which said fluorescent material is responsive to particulate radiation in the form of protons and electrons to produce fluorescent radiation lying within said wavelength band.

References Cited

UNITED STATES PATENTS

| | | | |
|---|---|---|---|
| 3,053,927 | 9/1962 | Viszlocky | 136—89 |
| 3,076,861 | 2/1963 | Samulon et al. | 136—89 |
| 3,350,234 | 10/1967 | Ule | 136—89 |
| 3,472,698 | 10/1969 | Mandelkorn | 136—89 |

FOREIGN PATENTS

| | | | |
|---|---|---|---|
| 615,938 | 3/1961 | Canada | 136—89 |

OTHER REFERENCES

Proc. 17th Annual Power Sources Conf., October 1963, "Effects of Radiation on Transmission of Glasses and Adhesives," by F. J. Campbell, pp. 19–22.

ALLEN B. CURTIS, Primary Examiner